US006872952B2

(12) United States Patent
Shimada et al.

(10) Patent No.: US 6,872,952 B2
(45) Date of Patent: Mar. 29, 2005

(54) ELECTRON OPTICAL SYSTEM ARRAY, METHOD OF MANUFACTURING THE SAME, CHARGED-PARTICLE BEAM EXPOSURE APPARATUS, AND DEVICE MANUFACTURING METHOD

(75) Inventors: Yasuhiro Shimada, Kanagawa (JP); Takayuki Yagi, Kanagawa (JP); Haruhito Ono, Kanagawa (JP); Hiroshi Maehara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 286 days.

(21) Appl. No.: 09/819,906

(22) Filed: Mar. 29, 2001

(65) Prior Publication Data

US 2001/0052576 A1 Dec. 20, 2001

(30) Foreign Application Priority Data

Mar. 31, 2000 (JP) ........................................ 2000-097066
Mar. 15, 2001 (JP) ........................................ 2001-074737

(51) Int. Cl.[7] .............................................. H01J 37/302
(52) U.S. Cl. ............................. 250/396 R; 250/492.22
(58) Field of Search ........................ 250/396 R, 492.22, 250/492.23, 492.2

(56) References Cited

U.S. PATENT DOCUMENTS

| | | | | |
|---|---|---|---|---|
| 4,200,794 | A | 4/1980 | Newberry et al. | 250/396 |
| 4,354,111 | A | 10/1982 | Williams et al. | 250/396 R |
| 4,419,182 | A | 12/1983 | Westerberg et al. | 156/644 |
| 4,419,580 | A | 12/1983 | Walker et al. | 250/396 R |
| 4,569,033 | A | 2/1986 | Collins et al. | 364/845 |
| 4,607,167 | A | 8/1986 | Petric | 250/492.2 |
| 4,742,234 | A | 5/1988 | Feldman et al. | 250/492.2 |
| 5,105,089 | A | 4/1992 | Yamada | 250/492.2 |
| 5,121,234 | A | 6/1992 | Kucera | 359/50 |

(Continued)

FOREIGN PATENT DOCUMENTS

| | | |
|---|---|---|
| JP | 56-19402 | 5/1981 |
| JP | 6-44093 | 2/1994 |
| JP | 2001-126651 | 5/2001 |

OTHER PUBLICATIONS

"Sub–Nanometer Miniature Electron Microscope", A.D. Feinerman, et al., Journal of Vacuum Science and Technology A, vol. 10, No. 4, Jul./Aug. 1992, 611–616.

"High Aspect Ratio Aligned Multilayer Microstructure Fabrication", K. Y. Lee, et al., Journal of Vacuum Science and Technology B, vol. 12, No. 6, Nov./Dec. 1994, pp. 3425–3430.

"Arrayed Miniature Electron Beam Columns For High Throughput Sub–100 nm Lithography", T. H. P. Chang, et al., Journal of Vacuum Science and Technology B, vol. 10, No. 6, Nov./Dec. 1992, pp. 2743–2748.

"Microstructures for Particle Beam Control", G. W. Jones, et al., Journal of Vacuum Science and Technology B, vol. 6, No. 6, Nov./Dec. 1988, pp. 2023–2027.

"A Multibeam Scheme for Electron–Beam Lithography", T. Sasaki, Journal of Vacuum Science and Technology, vol. 19, No. 4, Nov./Dec. 1981, pp. 963–965.

*Primary Examiner*—Kiet T. Nguyen
(74) *Attorney, Agent, or Firm*—Fitzpatrick, Cella, Harper & Scinto

(57) ABSTRACT

This invention relates to an electron optical system array having a plurality of electron lenses. The electron optical system array includes a plurality of electrode structures which are arranged along the paths of a plurality of charged-particle beams and have pluralities of apertures on the paths of the plurality of charged-particle beams. At least one of the plurality of electrode structures includes a substrate having a plurality of apertures for transmitting the plurality of charged-particle beams, and a plurality of electrodes extending from the side surfaces of the plurality of apertures to the peripheries of the plurality of apertures. At least the surface of the substrate is insulated.

25 Claims, 14 Drawing Sheets

U.S. PATENT DOCUMENTS

| | | | | | |
|---|---|---|---|---|---|
| 5,215,623 | A | * | 6/1993 | Takahashi et al. | 156/644 |
| 5,260,579 | A | | 11/1993 | Yasuda et al. | 250/492.2 |
| 5,324,930 | A | | 6/1994 | Jech, Jr. | 250/216 |
| 5,534,311 | A | | 7/1996 | Shaw et al. | 427/526 |
| 5,604,394 | A | | 2/1997 | Saito et al. | 313/422 |
| 5,617,131 | A | | 4/1997 | Murano et al. | 347/233 |
| 5,731,591 | A | | 3/1998 | Yamada et al. | 250/492.2 |
| 5,834,783 | A | | 11/1998 | Muraki et al. | 250/398 |
| 5,864,142 | A | | 1/1999 | Muraki et al. | 250/491.1 |
| 5,905,267 | A | | 5/1999 | Muraki | 250/492.22 |
| 5,929,454 | A | | 7/1999 | Muraki et al. | 250/491.1 |
| 5,939,725 | A | | 8/1999 | Muraki | 250/492.22 |
| 5,942,761 | A | | 8/1999 | Tuli | 250/556 |
| 5,973,332 | A | | 10/1999 | Muraki et al. | 250/492.2 |
| 5,981,954 | A | | 11/1999 | Muraki | 250/397 |
| 6,014,200 | A | | 1/2000 | Sogard et al. | 355/53 |
| 6,072,251 | A | | 6/2000 | Markle | 310/12 |
| 6,104,035 | A | | 8/2000 | Muraki | 250/492.22 |
| 6,107,636 | A | | 8/2000 | Muraki | 250/492.2 |
| 6,121,625 | A | | 9/2000 | Ito et al. | 250/492.22 |
| 6,137,103 | A | | 10/2000 | Giles et al. | 250/216 |
| 6,137,113 | A | | 10/2000 | Muraki | 250/492.22 |
| 6,166,387 | A | | 12/2000 | Muraki et al. | 250/492.2 |
| 6,184,850 | B1 | | 2/2001 | Suzuki et al. | 345/74 |
| 6,188,074 | B1 | | 2/2001 | Satoh et al. | 250/492.22 |
| 6,274,877 | B1 | | 8/2001 | Muraki | 250/492.23 |
| 6,323,499 | B1 | | 11/2001 | Muraki et al. | 250/492.22 |
| 6,337,485 | B1 | | 1/2002 | Muraki et al. | 250/492.2 |
| 6,381,702 | B1 | | 4/2002 | Ogasawara | 713/500 |
| 6,465,796 | B1 | | 10/2002 | Haraguchi et al. | 250/492.23 |
| 6,469,799 | B1 | | 10/2002 | Kajita | 358/1.16 |
| 6,472,672 | B1 | | 10/2002 | Muraki | 250/492.2 |
| 6,483,120 | B1 | | 11/2002 | Yui et al. | 250/491.1 |
| 6,515,409 | B2 | | 2/2003 | Muraki et al. | 313/359.1 |
| 6,566,664 | B2 | | 5/2003 | Muraki | 250/492.2 |
| 6,603,128 | B2 | | 8/2003 | Maehara et al. | 250/441.11 |
| 6,617,595 | B1 | | 9/2003 | Okunuki | 250/492.22 |
| 2002/0009901 | A1 | | 1/2002 | Maehara et al. | 438/795 |
| 2002/0160311 | A1 | | 10/2002 | Muraki et al. | 430/296 |
| 2002/0179855 | A1 | | 12/2002 | Muraki | 250/492.22 |
| 2003/0094584 | A1 | | 5/2003 | Yui et al. | 250/492.22 |
| 2003/0209673 | A1 | | 11/2003 | Ono et al. | 250/396 R |
| 2004/0061064 | A1 | | 4/2004 | Ono et al. | 250/396 R |

* cited by examiner

ELECTRON OPTICAL SYSTEM ARRAY, METHOD OF MANUFACTURING THE SAME, CHARGED-PARTICLE BEAM EXPOSURE APPARATUS, AND DEVICE MANUFACTURING METHOD

FIELD OF THE INVENTION

The present invention relates to an electron optical system array suitable for an exposure apparatus using charged-particle beams such as electron beams and, more particularly, to an electron optical system array having a plurality of electron lenses.

BACKGROUND OF THE INVENTION

In production of semiconductor devices, an electron beam exposure technique receives a great deal of attention as a promising candidate of lithography capable of micro-pattern exposure at a line width of 0.1 $\mu$m or less. There are several electron beam exposure methods. An example is a variable rectangular beam method of drawing a pattern with one stroke. This method suffers many problems as a mass-production exposure apparatus because of a low throughput. To attain a high throughput, there is proposed a pattern projection method of reducing and transferring a pattern formed on a stencil mask. This method is advantageous to a simple repetitive pattern but disadvantageous to a random pattern such as a logic interconnection pattern in terms of the throughput, and a low productivity disables practical application.

To the contrary, a multi-beam system for drawing a pattern simultaneously with a plurality of electron beams without using any mask has been proposed and is very advantageous to practical use because of the absence of physical mask formation and exchange. What is important in using multi-electron beams is the number of electron lenses formed in an array used in an electron optical system. The number of electron lenses determines the number of electron beams, and is a main factor which determines the throughput. Downsizing while improving the performance of the electron optical system array is one of keys to improving the performance of the multi-beam exposure apparatus.

Electron lenses are classified into electromagnetic and electrostatic types. The electrostatic electron lens does not require any coil core or the like, is simpler in structure than the electromagnetic electron lens, and is more advantageous to downsizing. Principal prior arts concerning downsizing of the electrostatic electron lens (electrostatic lens) will be described.

U.S. Pat. No. 4,419,580 proposes an electron optical system array in which electron lenses are two-dimensionally arrayed on an Si substrate and Si substrates are aligned by V-grooves and cylindrical spacers. K. Y. Lee et al. (J. Vac. Sci. Technol. B12(6), November/December 1994, pp. 3,425–3,430) disclose a multilayered structure of Si and Pyrex glass fabricated by using anodic bonding, and provides microcolumn electron lenses aligned at a high precision.

However, either U.S. Pat. No. 4,419,580 or K. Y. Lee et al. do not disclose a detailed structure of each aperture electrode.

SUMMARY OF THE INVENTION

The present invention has been made to overcome the conventional drawbacks, and has as its principal object to provide an improvement of the prior arts. It is an object of the present invention to provide an electron optical system array which realizes various conditions such as downsizing, high precision, and high reliability at high level. It is another object of the present invention to provide a high-precision exposure apparatus using the electron optical system array, a high-productivity device manufacturing method, a semiconductor device production factory, and the like.

According to the first aspect of the present invention, there is provided an electrode structure serving as a building component of an electron optical system array having a plurality of electron lenses, comprising a substrate having a plurality of apertures for transmitting a plurality of charged-particle beams, and a plurality of electrodes extending from side surfaces of the plurality of apertures to peripheries of the plurality of apertures. At least a surface of the substrate is insulated.

According to a preferred mode of the present invention, the surface of the substrate has an insulating film. According to another preferred mode of the present invention, electrodes formed in at least two apertures are electrically connected. For example, the plurality of apertures may be arrayed, and electrodes formed in apertures of each column may be electrically connected. The electrode structure preferably further comprises an alignment portion for aligning the electrode structure with another electrode structure. The substrate includes, e.g., a silicon substrate covered with an insulating film after the plurality of apertures are formed.

According to the second aspect of the present invention, there is provided an electron optical system array having a plurality of electron lenses, comprising a plurality of electrode structures which are arranged along paths of a plurality of charged-particle beams and have pluralities of apertures on the paths of the plurality of charged-particle beams. At least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

According to a preferred mode of the present invention, the surface of the substrate has an insulating film. According to another preferred mode of the present invention, electrodes formed in at least two apertures of the substrate are electrically connected. For example, the plurality of apertures of the plurality of electrode structures may be arrayed and electrodes formed in each column of the substrate may be electrically connected. According to still another preferred mode of the present invention, the plurality of electrode structures preferably include a shield electrode structure.

According to still another preferred mode of the present invention, each of the plurality of electrode structures comprises a membrane portion which has the plurality of apertures and a support portion which supports the membrane portion, and the electron optical system array further comprises a first spacer interposed between support portions of adjacent electrode structures to define a distance between the support portions, and/or a second spacer interposed between membrane portions of adjacent electrode structures to define a distance between the membrane portions.

According to the third aspect of the present invention, there is provided a method of manufacturing an electrode structure serving as a building component of an electron optical system having a plurality of electron lenses, comprising the steps of forming in a substrate a plurality of apertures for transmitting a plurality of charged-particle beams, covering the substrate having the plurality of apertures with an insulating film, and forming, in the substrate covered with the insulating film, a plurality of electrodes extending from side surfaces of the plurality of apertures to peripheries of the plurality of apertures. In this case, it is preferable that the substrate include a silicon substrate, and in the step of forming a plurality of apertures, a plurality of apertures be formed in the silicon substrate by plasma dry etching.

According to the fourth aspect of the present invention, there is provided a charged-particle beam exposure apparatus comprising a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. In this case, the electron optical system array includes a plurality of electrode structures which are arranged along paths of a plurality of charged-particle beams concerning the plurality of intermediate images and have pluralities of apertures on the paths of the plurality of charged-particle beams. At least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

According to the fifth aspect of the present invention, there is provided a device manufacturing method comprising the steps of installing a plurality of semiconductor manufacturing apparatuses including a charged-particle beam exposure apparatus in a factory, and manufacturing a semiconductor device by using the plurality of semiconductor manufacturing apparatuses. In this case, the charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrode structures which are arranged along paths of a plurality of charged-particle beams concerning the plurality of intermediate images and have pluralities of apertures on the paths of the plurality of charged-particle beams. At least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

The manufacturing method preferably further comprises the steps of connecting the plurality of semiconductor manufacturing apparatuses by a local area network, connecting the local area network to an external network of the factory, acquiring information about the charged-particle beam exposure apparatus from a database on the external network by using the local area network and the external network, and controlling the charged-particle beam exposure apparatus on the basis of the acquired information.

According to the sixth aspect of the present invention, there is provided a semiconductor manufacturing factory comprising a plurality of semiconductor manufacturing apparatuses including a charged-particle beam exposure apparatus, a local area network for connecting the plurality of semiconductor manufacturing apparatuses, and a gateway for connecting the local area network to an external network of the semiconductor manufacturing factory. In this case, the charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrode structures which are arranged along paths of a plurality of charged-particle beams concerning the plurality of intermediate images and have pluralities of apertures on the paths of the plurality of charged-particle beams. At least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

According to the seventh aspect of the present invention, there is provided a maintenance method for a charged-particle beam exposure apparatus, comprising the steps of preparing a database for storing information about maintenance of the charged-particle beam exposure apparatus on an external network of a factory where the charged-particle beam exposure apparatus is installed, connecting the charged-particle beam exposure apparatus to a local area network in the factory, and maintaining the charged-particle beam exposure apparatus on the basis of the information stored in the database by using the external network and the local area network. In this case, the charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrode structures which are arranged along paths of a plurality of charged-particle beams concerning the plurality of intermediate images and have pluralities of apertures on the paths of the plurality of charged-particle beams. At least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below.

First Embodiment

Figure 1:
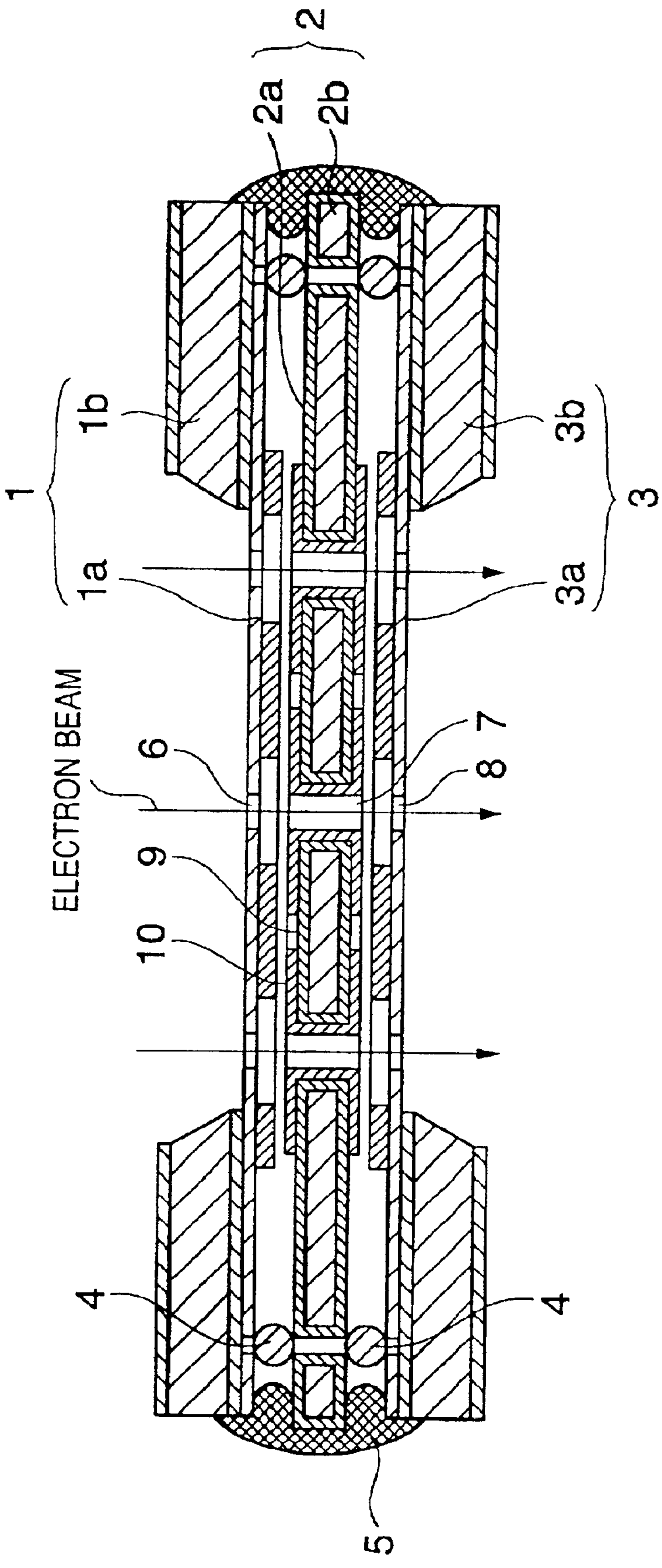
FIG. 1 is a sectional view for explaining the structure of an electron optical system array according to first embodiment.

An electron optical system array according to the first embodiment of the present invention will be described with reference to FIG. 1. This electron optical system array has upper, middle, and lower electrode structures 1, 2, and 3. The upper, middle, and lower electrode structures 1, 2, and 3 respectively comprise membrane portions 1*a*, 2*a*, and 3*a*, and support portions 1*b*, 2*b*, and 3*b* which support corresponding membranes. Adjacent electrode structures are arranged via spacers 4 at their support portions and fixed with an adhesive 5. A preferable example of the spacer 4 is a fiber. The middle electrode structure 2 has a substrate in which a plurality of through holes (apertures) 7 are formed, an insulating layer 9 uniformly formed to cover the surface of the substrate, and a plurality of divided electrodes 10 formed on the insulating layer 9. Each divided electrode 10 is formed on the side surface of the substrate inside a corresponding through hole (aperture) 7 and substrate surfaces (two surfaces) near the through hole. For descriptive convenience, the first embodiment exemplifies only 3×3 apertures for each electrode element, but in practice the electrode element may be equipped with a larger number of apertures (e.g., 8×8 apertures).

A method of fabricating the electron optical system array will be explained. A method of forming the upper and lower electrode structures 1 and 3 will be described with reference to FIGS. 2A to 2F. In the first embodiment, the upper and lower electrode structures 1 and 3 have the same structure.

Figure 2A:
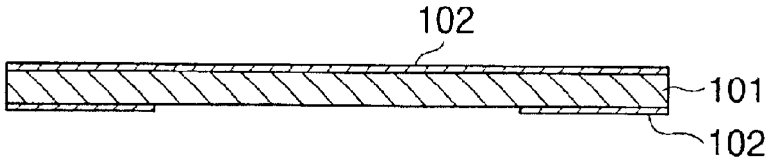
FIGS. 2A to 2F are views for explaining a method of forming upper and lower electrode structures.

A silicon wafer 101 of the <100> direction is prepared, and 300-nm thick $SiO_2$ films are formed as mask layers 102 on the two surfaces of the substrate 101 by thermal oxidation. A portion of one mask layer that serves as a prospective electron beam (charged-particle beam) path (aperture 107) is removed by patterning the mask layer by resist and etching processes (FIG. 2A).

Figure 2B:
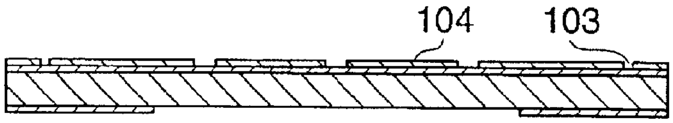

Titanium and copper are successively deposited to film thicknesses of 5 nm and 5 μm and patterned by resist and etching processes to form an electrode layer 104 and alignment grooves 103 (FIG. 2B). The deposition method is deposition using resistance heating or an electron beam, sputtering, or the like. As another electrode material, titanium/gold or titanium/platinum may be used.

Figure 2C:
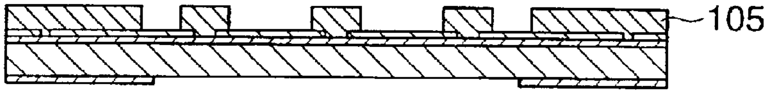

A resist pattern 105 serving as a plating mold is formed on the electrode layer 104 (FIG. 2C). More specifically, the resist is formed to a film thickness of 110 μm by using SU-8 (MicroChem. Co) mainly consisting of an epoxidized bisphenol A oligomer. Exposure is performed for, e.g., 60 sec by a contact type exposure apparatus using a high-pressure mercury lamp. After exposure, post-exposure bake (PEB) is done on a hot plate at 85° C. for 30 min. After the substrate is gradually cooled to room temperature, the resist is developed with propylene glycol monomethyl ether acetate for 5 min to complete the plating mold pattern. As another resist, a polyvinylphenol-based or cyclized rubber-based negative resist or a novolac-based positive resist can be used. For a resist material which is difficult to form a thick film, a thick film may be formed by applying the resist material a plurality of number of times.

Figure 2D:
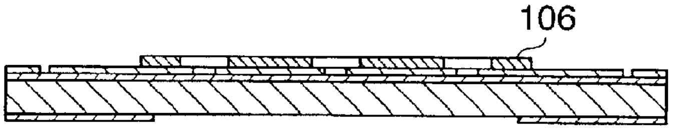

The gaps of the resist pattern 105 are filled with shield electrodes 106 by electroplating (FIG. 2D). More specifically, the gaps of the resist pattern 105 are filled with a 100-μm thick copper pattern by electroplating using, e.g., an acid copper plating solution at a plating solution flow rate of 5 L/min, a current density of 7.5 $mA/cm^2$, and a solution temperature of 28° C. for 6 h and 40 min. The SU-8 resist 105 is removed in N-methylpyrrolidone (NMP) at 80° C., and the substrate is cleaned and dried by IPA to obtain a copper pattern as the shield electrodes 106. The metal used can be a nonmagnetic material such as gold or platinum, instead of copper.

Figure 2E:
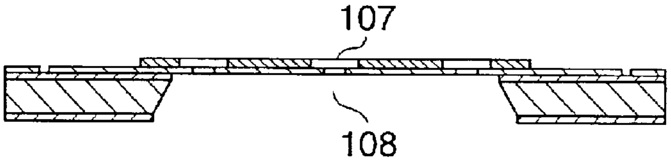
Figure 2F:
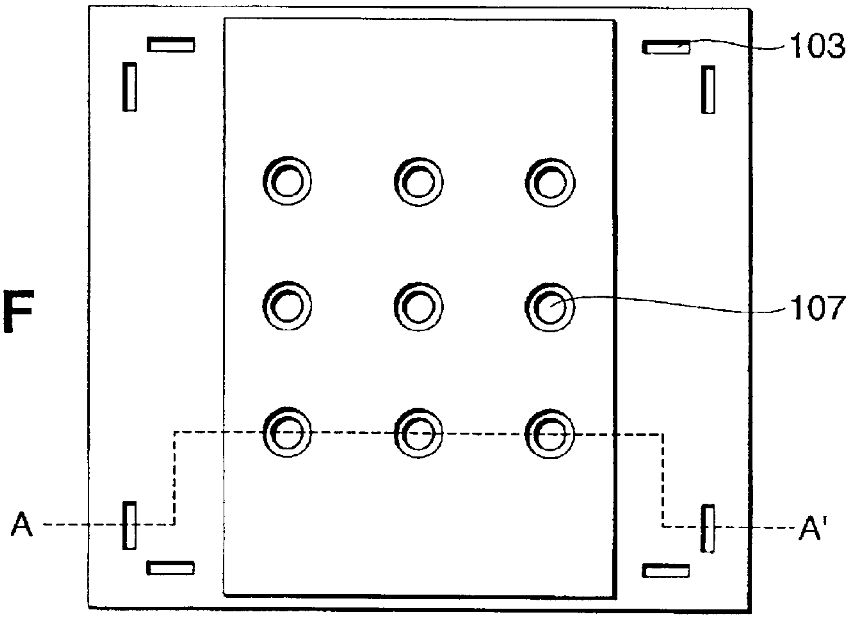

The plating surface is protected with polyimide (not shown). The silicon substrate 101 is etched back from the other surface at 90° C. by using a 22% aqueous tetramethylammonium hydroxide solution. Etching is continued until silicon is etched away and the other mask layer 102 is exposed to form a hollow portion 108. The substrate is cleaned with water and dried. The mask layer 102 exposed after dry etching of silicon is etched away by using tetrafluoromethane in a dry etching apparatus. The polyimide film which protects the other surface is removed by ashing (FIG. 2E). FIG. 2F is a plan view of the structure in FIG. 2E.

Figure 3A:
FIGS. 3A to 3F are views for explaining a method of forming a middle electrode structure.
Figure 3B:
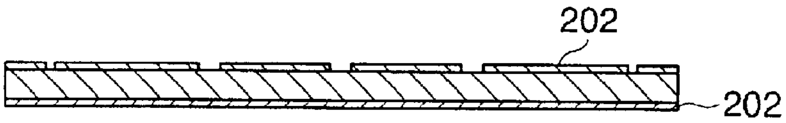

A method of forming the middle electrode 2 will be explained with reference to FIGS. 3A to 3F. A silicon wafer of the <100> direction is prepared as a substrate 201 (FIG. 3A). After the substrate 201 is polished to a thickness of 100 μm, 300-nm thick $SiO_2$ films are formed as mask layers 202 on the two surfaces of the substrate 201 by thermal oxidation. Portions of one mask layer 202 that serve as prospective apertures and alignment grooves are removed by patterning the mask layer 202 by resist and etching processes (FIG. 3B).

Figure 3C:
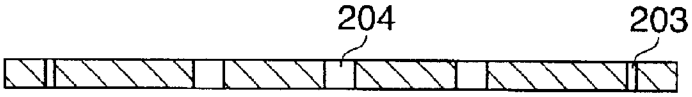

Silicon is etched by a dry etching apparatus using a high-density plasma capable of processing at a high aspect ratio, thus forming pluralities of apertures 204 and alignment grooves 203. This method can form cylindrical apertures perpendicular to the surface of the substrate 201 at a high precision (FIG. 3C).

Figure 3D:
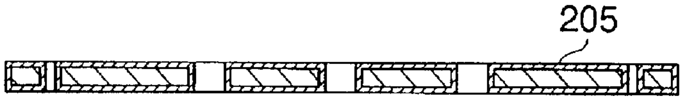

An $SiO_2$ insulating layer 205 is deposited to 300 nm so as to cover the substrate 201 by thermal oxidation (FIG. 3D).

Figure 3E:
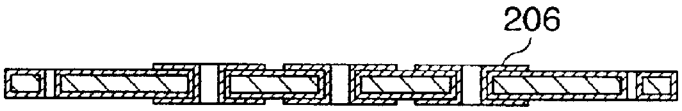
Figure 3F:
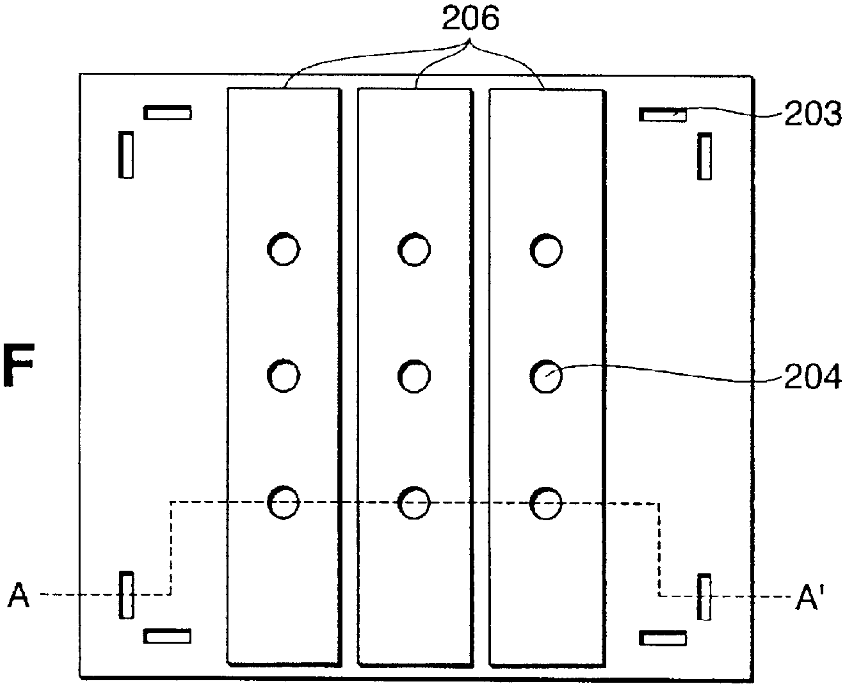

After production nuclei are formed on the surface of the insulating layer 205, Au is deposited to 1 μm by electroless plating and patterned by photolithography to form divided wiring lines 206 (FIG. 3E). FIG. 3F is a plan view of the structure in FIG. 3E.

As another method of forming metal films on the two surfaces of the substrate, other than the above method, metal films can be formed by sputtering or vacuum evaporation from the two surfaces, or metal films can be formed by chemical vapor deposition.

Electrode structures formed in this manner are aligned and joined by the following procedures. First, the upper and middle electrode structures 1 and 2 are coupled via the spacers 4 at their alignment grooves and fixed with the adhesive 5. Then, the lower electrode structure 3 is similarly coupled to the obtained electrode structure via the spacers 4 and fixed with the adhesive 5. According to this method, the outer size of the spacer 4 determines the interval between electrodes. A preferably example of the adhesive is one almost free from degassing in vacuum.

Figure 7:
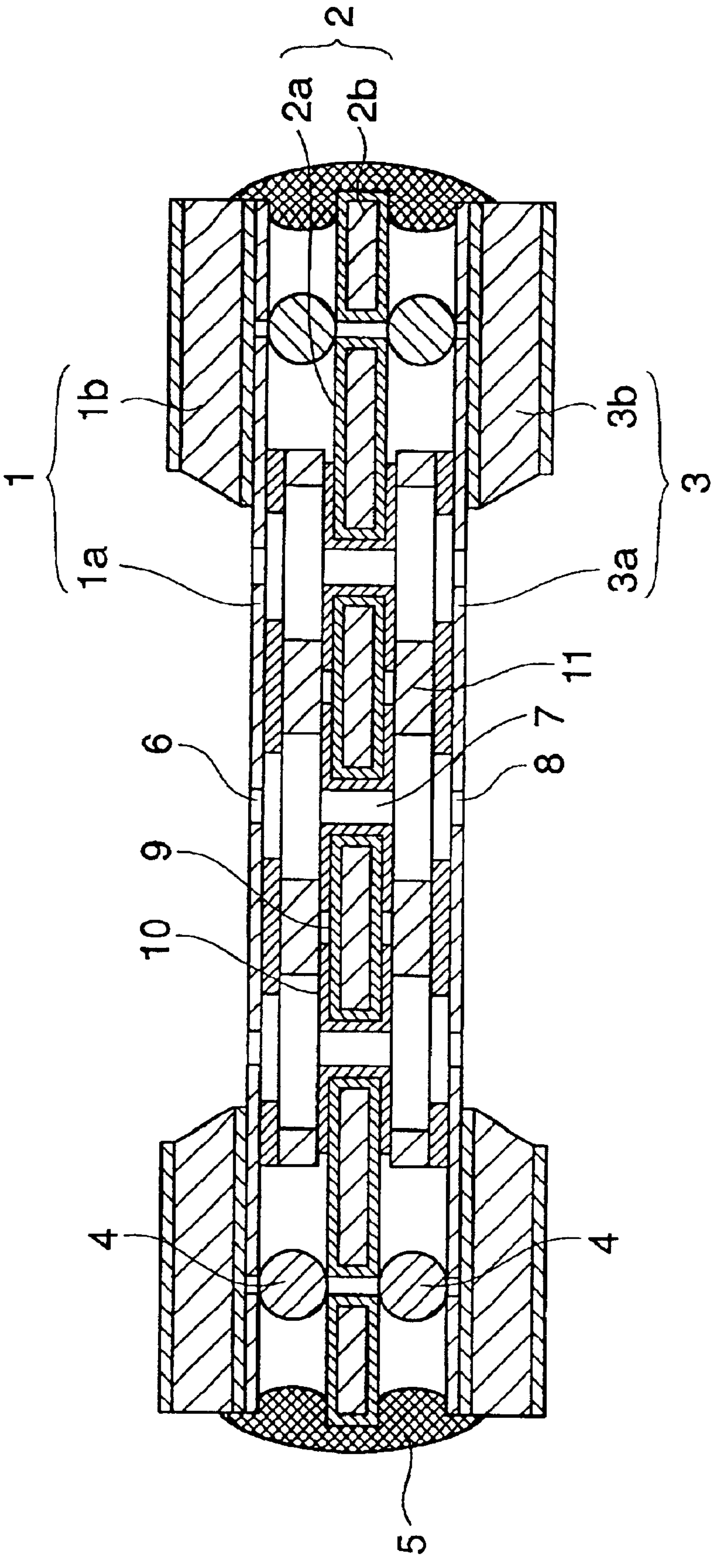
FIG. 7 is a sectional view showing a modification of the first embodiment.

FIG. 7 shows an electron optical system array according to a modification of the first embodiment. The electron optical system array of the modification has inter-membrane spacers 11 between the membrane portion 1*a* of the upper electrode structure 1 and the membrane portion 2*a* of the middle electrode structure 2 and between the membrane portion 2*a* of the middle electrode structure 2 and the membrane portion 3*a* of the lower electrode structure 3. The inter-membrane spacers 11 are located at positions where they do not close the apertures of the upper, middle, and lower electrode structures 1, 2, and 3. The inter-membrane spacers 11 are, e.g., 100 μm in thickness. The inter-membrane spacers 11 can increase the strength of the electron optical system array and maintain the distance between membranes at a high precision. Further, the inter-membrane spacers 11 can effectively suppress deformation of the membrane caused by, e.g., an electrostatic force generated by a potential applied to the electrode.

This electron optical system array is fabricated by the following procedures. While the upper and middle electrode structures 1 and 2 sandwich the spacers 4 at their alignment grooves, and the membranes 1*a* and 2*a* sandwich the inter-membrane spacers 11, the upper and middle electrode structures 1 and 2 are fixed with the adhesive 5. Similarly, while sandwiching the spacers 4 and inter-membrane spacers 11, the lower electrode structure 3 is coupled to the obtained electrode structure and fixed with the adhesive 5.

Second Embodiment

Figure 4:
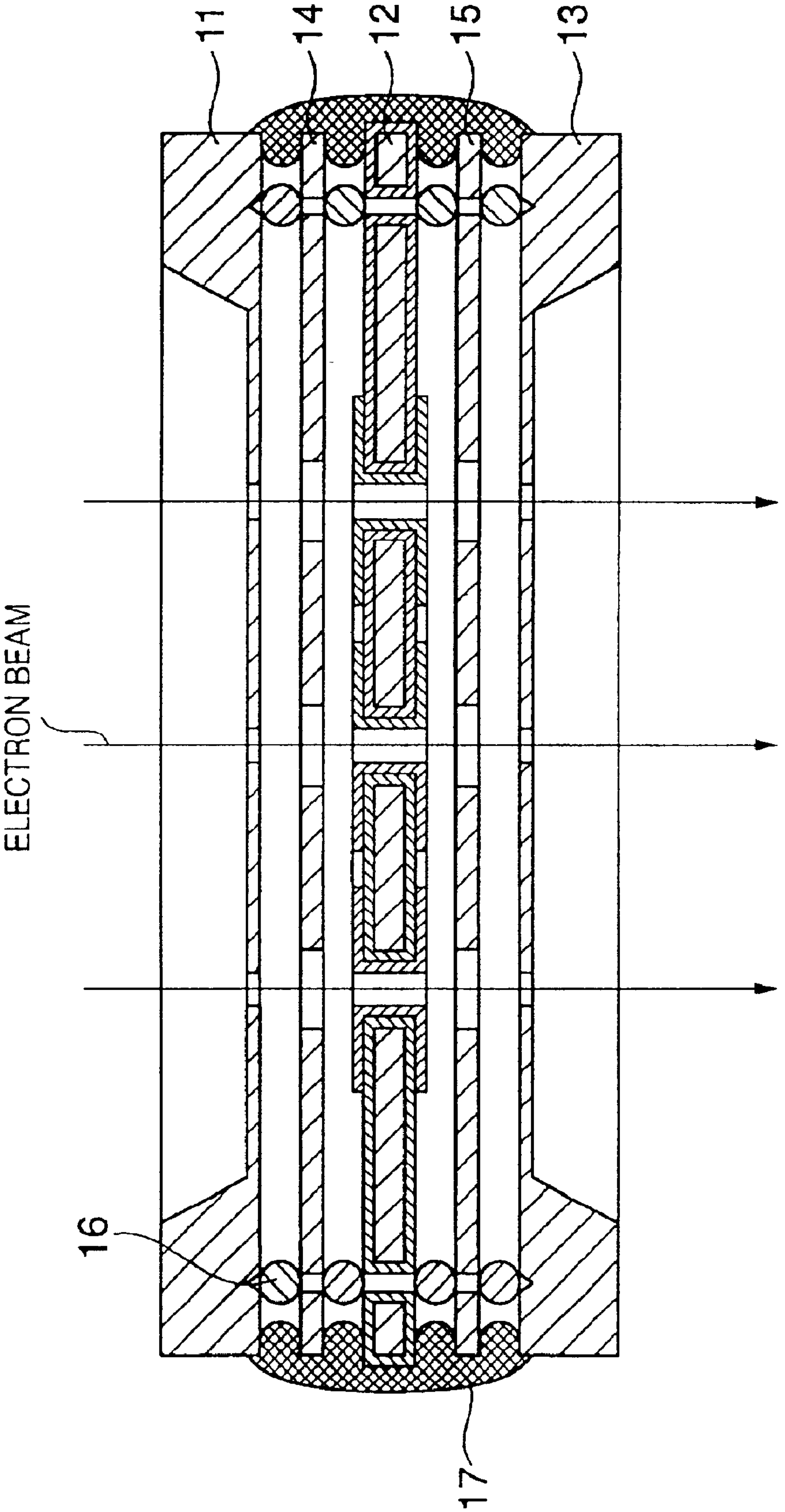
FIG. 4 is a sectional view for explaining the structure of an electron optical system array according to second embodiment.

FIG. 4 shows an electron optical system array according to the second embodiment. In this electron optical system array, an upper shield electrode 14 is interposed between an upper electrode structure 11 and a middle electrode structure 12, whereas a lower shield electrode 15 is interposed between the middle electrode structure 12 and a lower electrode structure 13. Each electrode structure has a membrane portion and a support portion which supports the membrane portion. Adjacent electrode structures are stacked via spacers 16 at their support portions and fixed with an adhesive 17.

FIGS. 5A to 5E are views for explaining a method of forming the upper and lower electrode structures 11 and 13. In the second embodiment, the upper and lower electrode structures 11 and 13 have the same structure.

Figure 5A:
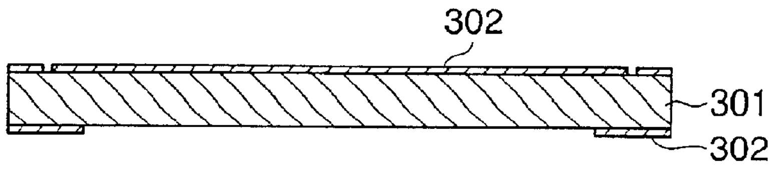
FIGS. 5A to 5E are views for explaining a method of forming upper and lower electrode structures.

A silicon wafer 301 of the <100> direction that is made conductive by doping an impurity is prepared, and 300-nm thick $SiO_2$ films are formed as mask layers 302 on the two surfaces of the substrate 301 by thermal oxidation. Part of the mask layer 302 on the lower surface is removed by patterning the mask layer 302 by photolithography and etching processes (FIG. 5A). Note that the same effects can also be attained by forming a film of a conductive material such as a metal on the surface of the substrate 301, instead of doping an impurity.

Figure 5B:
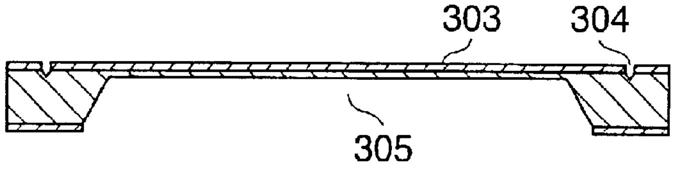

The silicon substrate 301 is etched from the lower surface to a thickness of 20 μm at 90° C. by using a 22% aqueous tetramethylammonium hydroxide solution (FIG. 5B). As a result, a hollow portion 305 and membrane portion 303 are formed.

Figure 5C:
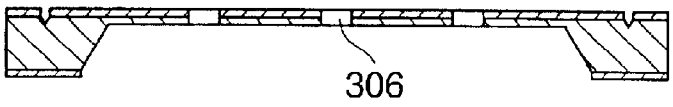

The mask layer 302 in a predetermined region on the surface of the silicon substrate 301, and the silicon substrate 301 are etched to form a plurality of apertures 306 (FIG. 5C).

Figure 5D:
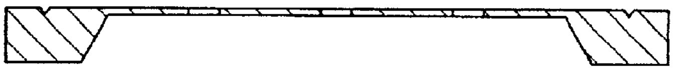
Figure 5E:
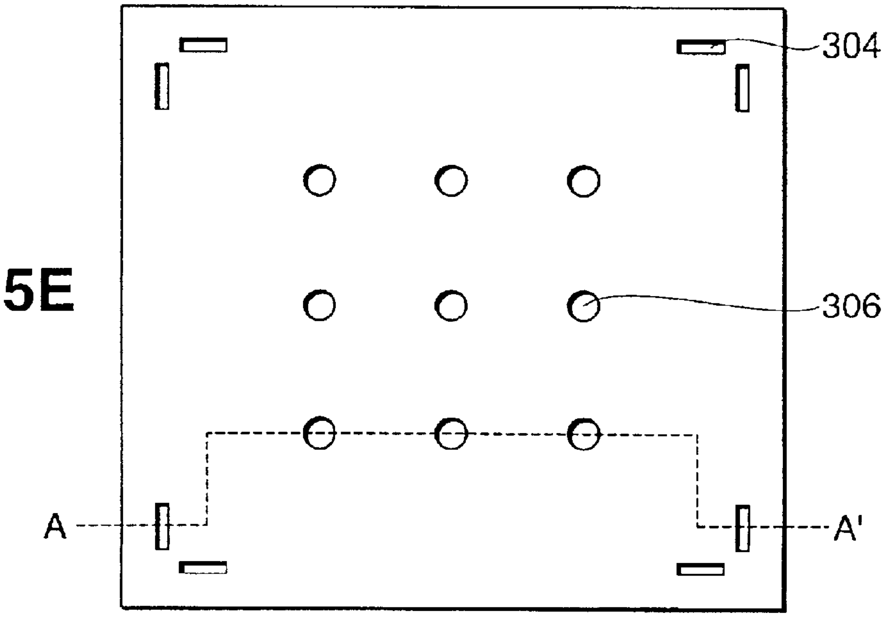

The remaining mask layer 302 is removed by using an aqueous solution mixture of hydrofluoric acid and ammonium fluoride (FIG. 5D). FIG. 5E is a plan view of the structure in FIG. 5D.

FIGS. 6A to 6D are views for explaining a method of forming the upper and lower shield electrode structures 14 and 15. In the second embodiment, the upper and lower shield electrode structures 14 and 15 have the same structure.

Figure 6A:
FIGS. 6A to 6D are views for explaining a method of forming a shield electrode structure.
Figure 6B:
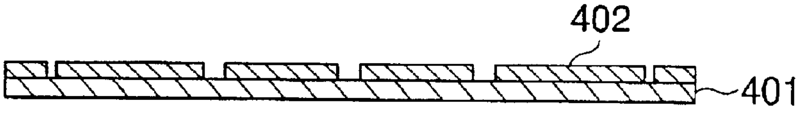

A silicon wafer 401 of the <100> direction that is made conductive by doping an impurity is prepared (FIG. 6A). After the substrate 401 is polished to a thickness of 100 μm, a resist is applied to form a pattern 402 at aperture and alignment groove portions by photolithography (FIG. 6B).

Figure 6C:
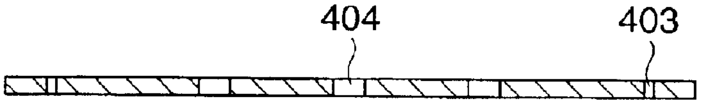
Figure 6D:
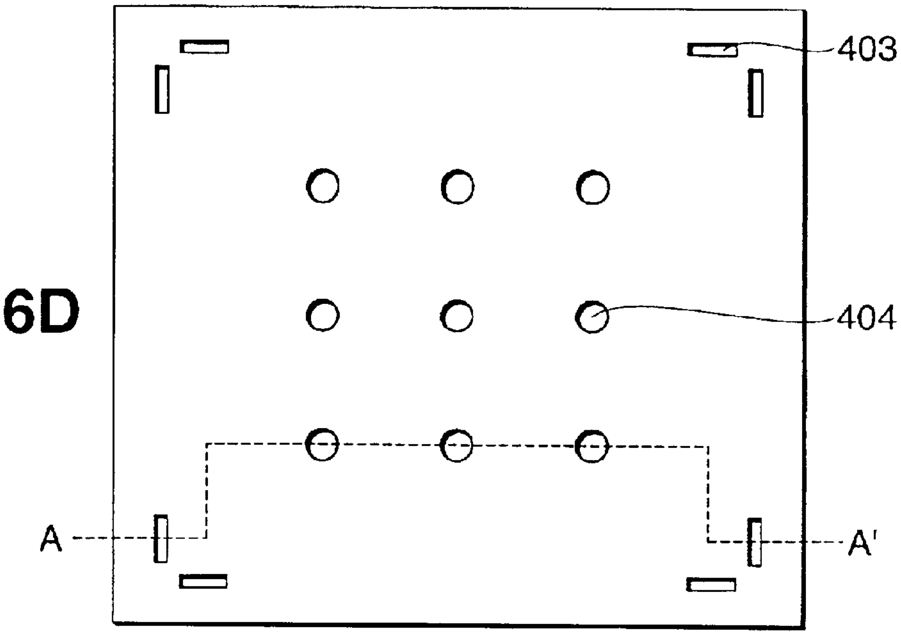

The silicon substrate 401 is etched by a dry etching apparatus using a high-density plasma capable of processing at a high aspect ratio, thus forming pluralities of apertures 404 and marker grooves 403. Thereafter, the resist 402 is removed (FIG. 6C). FIG. 6D is a plan view of the structure in FIG. 6C.

Electrode structures formed in this way are aligned and joined. More specifically, the upper and shield electrode structures 11 and 14 are joined, and this structure is joined to the middle electrode structure 12. The obtained structure is joined to the shield electrode structure 15 and then to the lower electrode structure 13 to complete the electron optical system array.

Also in the second embodiment, similar to the modification of the first embodiment, inter-membrane spacers are preferably inserted at all or some of intervals between the membrane portions of the upper and shield electrode structures 11 and 14, between the membrane portions of the shield, middle, and shield electrode structures 14, 12, and 15, and between the membrane portions of the shield and lower electrode structures 15 and 13.

Electron Beam Exposure Apparatus

Figure 8:
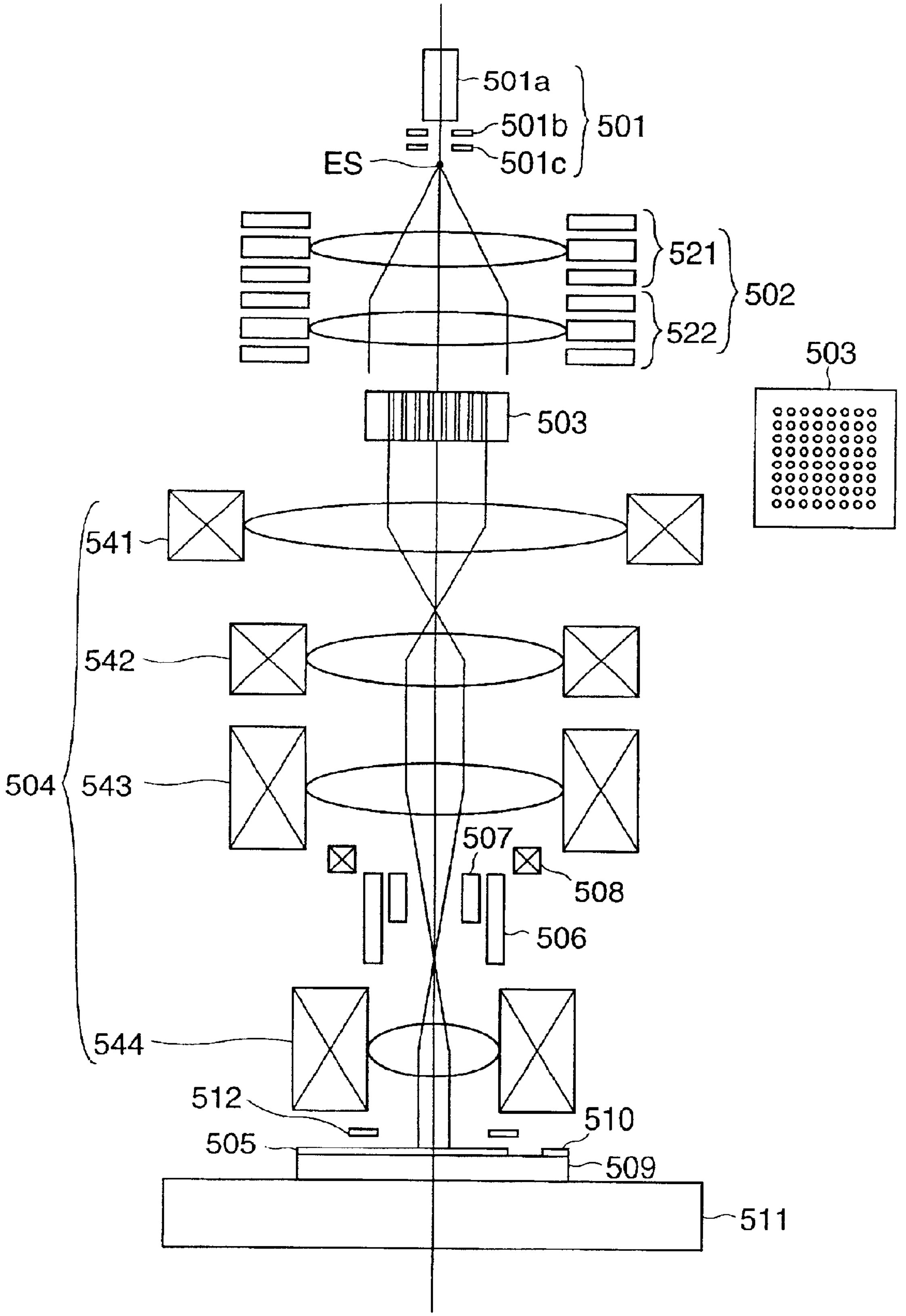
FIG. 8 is a view showing an entire multi-electron beam exposure apparatus.

A multi-beam charged-particle exposure apparatus (electron beam exposure apparatus) will be exemplified as a system using an electron optical system array as described in each of the above-described embodiments. FIG. 8 is a schematic view showing the overall system. In FIG. 8, an electron gun 501 as a charged-particle source is constituted by a cathode 501*a*, grid 501*b*, and anode 501*c*. Electrons emitted by the cathode 501*a* form a crossover image (to be referred to as an electron source ES hereinafter) between the grid 501*b* and the anode 501*c*. An electron beam emitted by the electron source ES irradiates a correction electron optical system 503 via an irradiation electron optical system 502 serving as a condenser lens. The irradiation electron optical system 502 is comprised of electron lenses (Einzel lenses) 521 and 522 each having three aperture electrodes. The correction electron optical system 503 includes an electron optical system array to which the electron optical system array is applied, and forms a plurality of intermediate images of the electron source ES (details of the structure will be described later). The correction electron optical system 503 adjusts the formation positions of intermediate images so as to correct the influence of aberration of a projection electron optical system 504. Each intermediate image formed by the correction electron optical system 503 is reduced and projected by the projection electron optical system 504, and forms an image of the electron source ES on a wafer 505 as a surface to be exposed. The projection electron optical system 504 is constituted by a symmetrical magnetic doublet made up of a first projection lens 541 (543) and second projection lens 542 (544). Reference numeral 506 denotes a deflector for deflecting a plurality of electron beams from the correction electron optical system 503 and simultaneously displacing a plurality of electron source images on the wafer 505 in the X and Y directions; 507, a dynamic focus coil for correcting a shift in the focal position of an electron source image caused by deflection aberration generated when the deflector 506 operates; 508, a dynamic stigmatic coil for correcting astigmatism among deflection aberrations generated by deflection; 509, a θ-Z stage which supports the wafer 505, is movable in the optical axis AX (Z-axis) direction and the rotational direction around the Z-axis, and has a stage reference plate 510 fixed thereto; 511, an X-Y stage which supports the θ-Z stage and is movable in the X and Y directions perpendicular to the optical axis AX (Z-axis); and 512, a reflected-electron detector for detecting reflected electrons generated upon irradiating a mark on the reference plate 510 with an electron beam.

Figure 9A:
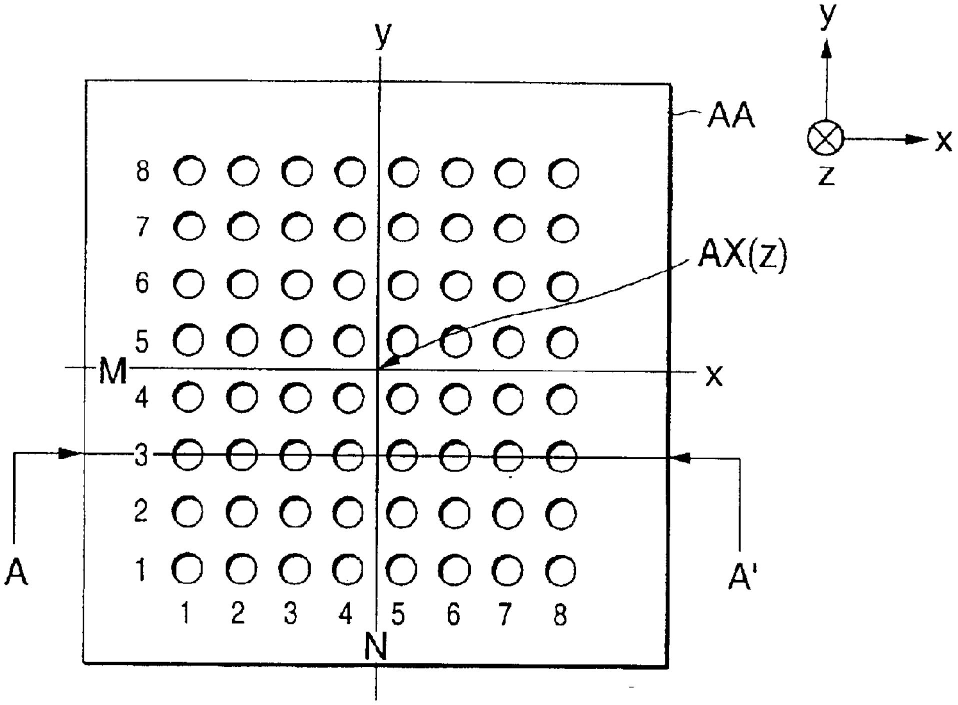
FIGS. 9A and 9B are a plan view and sectional view, respectively, for explaining details of a correction electron optical system.
Figure 9B:
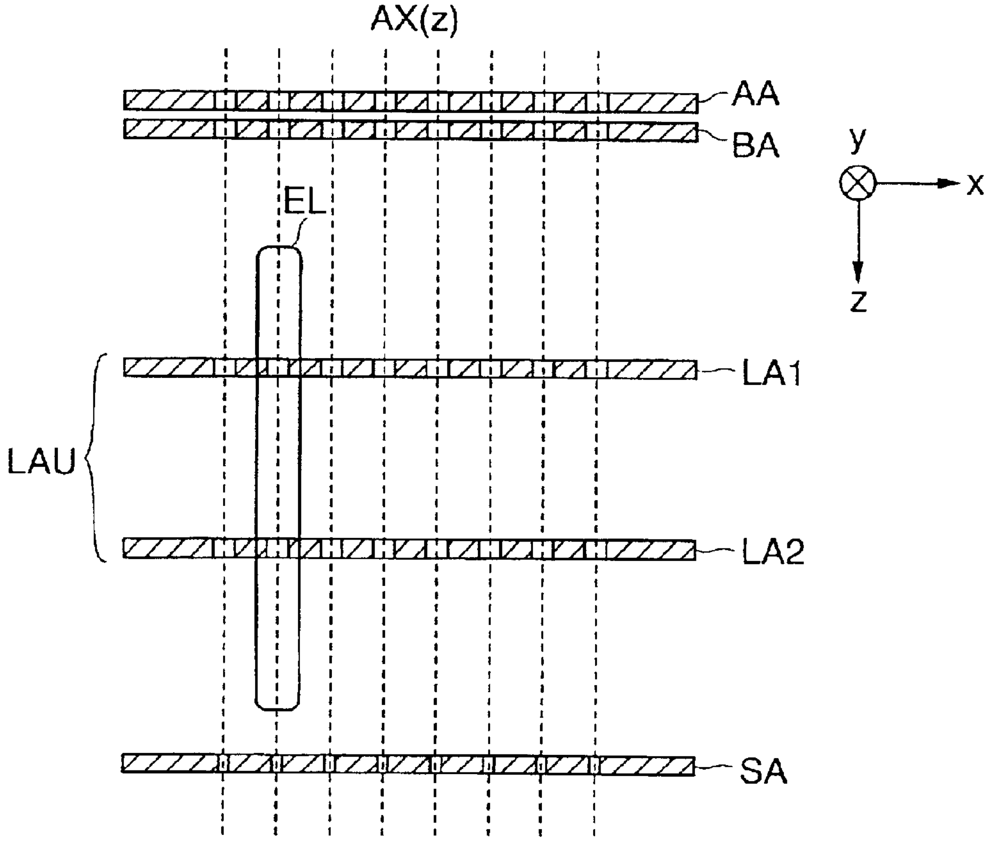

FIGS. 9A and 9B are views for explaining details of the correction electron optical system 503. The correction electron optical system 503 comprises an aperture array AA, blanker array BA, element electron optical system array unit LAU, and stopper array SA along the optical axis. FIG. 9A is a view of the correction electron optical system 503 when viewed from the electron gun 501, and FIG. 9B is a sectional view taken along the line A–A' in FIG. 9A. As shown in FIG. 9A, the aperture array AA has an array (8×8) of apertures regularly formed in a substrate, and splits an incident electron beam into a plurality of (64) electron beams. The blanker array BA is constituted by forming on one substrate a plurality of deflectors for individually deflecting a plurality of electron beams split by the aperture array AA. The element electron optical system array unit LAU is formed from first and second electron optical system arrays LA1 and LA2 as electron lens arrays each prepared by two-dimensionally arraying a plurality of electron lenses on the same surface. The electron optical system arrays LA1 and LA2 have a structure as an application of the electron optical system array described in the above embodiments to an 8×8 array. The first and second electron optical system arrays LA1 and LA2 are fabricated by the above-mentioned method. The element electron optical system array unit LAU constitutes one element electron optical system EL by the electron lenses of the first and second electron optical system arrays LA1 and LA2 that use the common X-Y coordinate system. The stopper array SA has a plurality of apertures formed in a substrate, similar to the aperture array AA. Only a beam deflected by the blanker array BA is shielded by the stopper array SA, and ON/OFF operation of an incident beam to the wafer 505 is switched for each beam under the control of the blanker array.

Since the charged-particle beam exposure apparatus of this embodiment adopts an excellent electron optical system array as described above for the correction electron optical system, an apparatus having a very high exposure precision can be provided and can increase the integration degree of a device to be manufactured in comparison with the prior art.

Example of Semiconductor Production System

A production system for a semiconductor device (semiconductor chip such as an IC or LSI, liquid crystal panel, CCD, thin-film magnetic head, micromachine, or the like) using the exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 10:
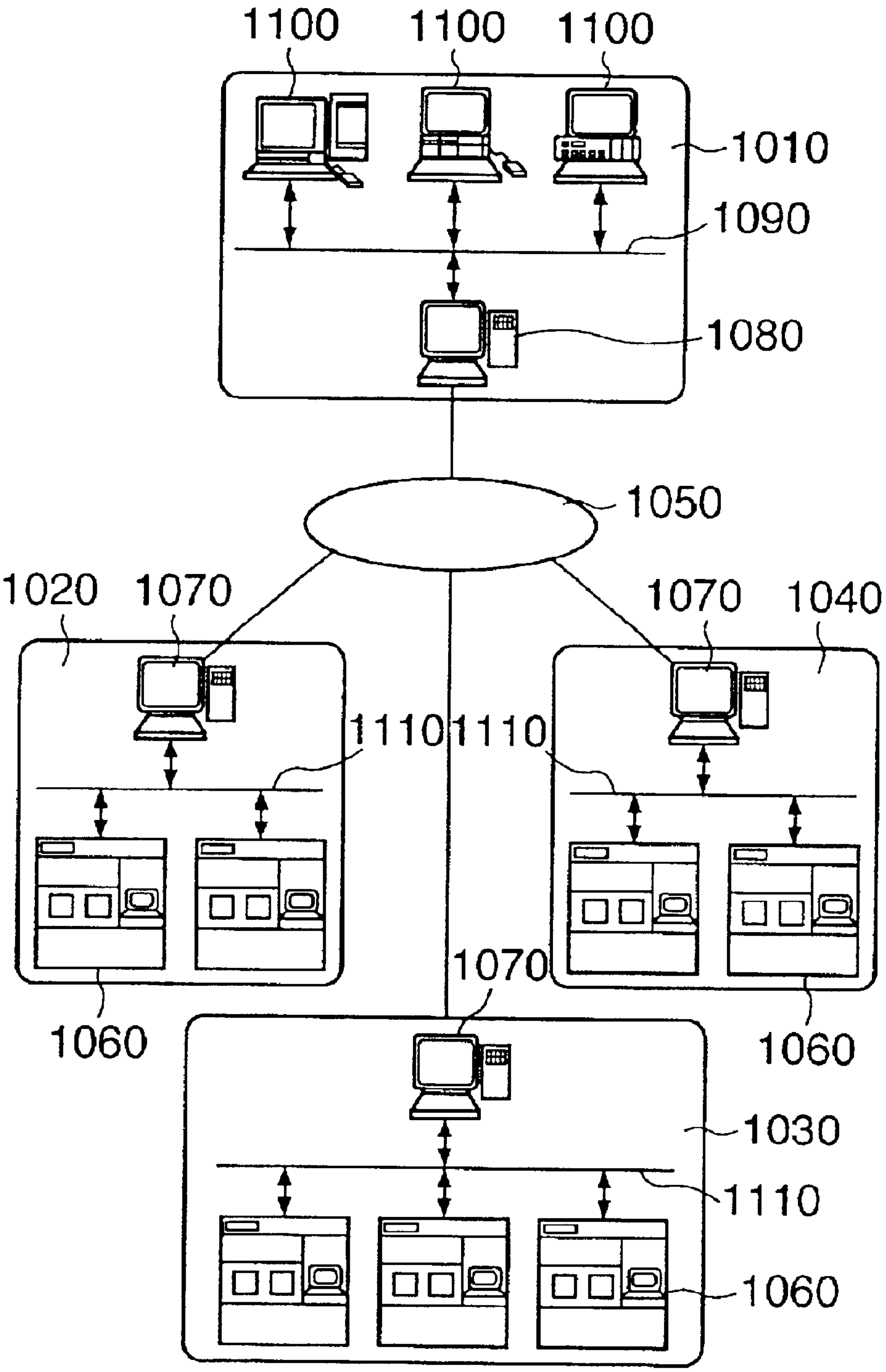
FIG. 10 is a view showing the concept of a semiconductor device production system when viewed from a given angle.

FIG. 10 shows the overall system cut out at a given angle. In FIG. 10, reference numeral 1010 denotes a business office of a vendor (apparatus supply manufacturer) which provides a semiconductor device manufacturing apparatus. Assumed examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 1010 comprises a host management system 1080 for providing a maintenance database for the manufacturing apparatus, a plurality of operation terminal computers 1100, and a LAN (Local Area Network) 1090 which connects the host management system 1080 and computers 1100 to construct an intranet. The host management system 1080 has a gateway for connecting the LAN 1090 to Internet 1050 as an external network of the business office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus for monitoring the operation status of each manufacturing apparatus 1060. The host management system 1070 in each of the factories 1020 to 1040 has a gateway for connecting the LAN 1110 in the factory to the Internet 1050 as an external network of the factory. Each factory can access the host management system 1080 of the vendor 1010 from the LAN 1110 via the Internet 1050. Typically, the security function of the host management system 1080 authorizes access of only a limited user to the host management system 1080.

In this system, the factory notifies the vender via the Internet 1050 of status information (e.g., the symptom of a manufacturing apparatus in trouble) representing the operation status of each manufacturing apparatus 1060. The vender transmits, to the factory, response information (e.g., information designating a remedy against the trouble, or remedy software or data) corresponding to the notification, or maintenance information such as the latest software or help information. Data communication between the factories 1020 to 1040 and the vender 1010 and data communication via the LAN 1110 in each factory typically adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

Figure 11:
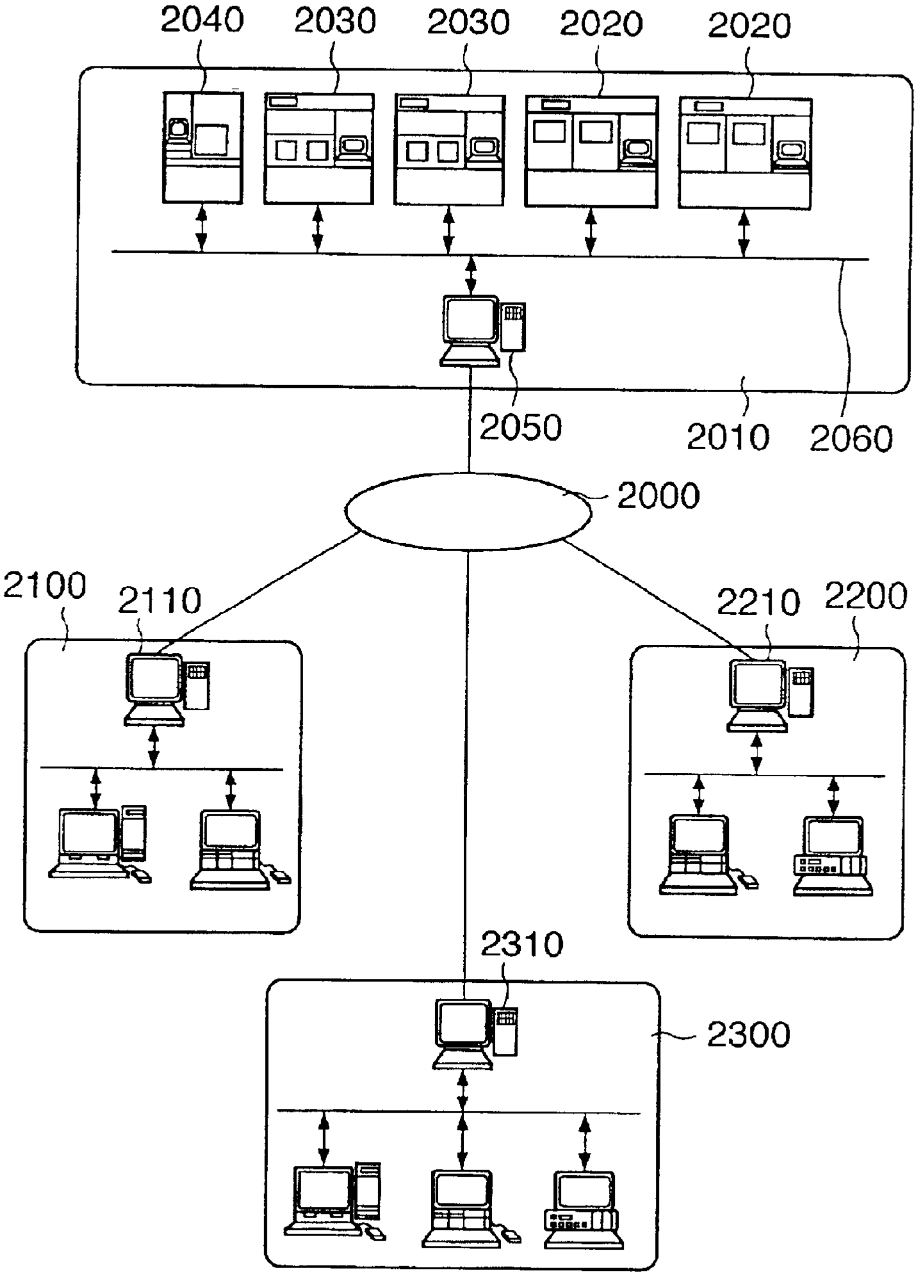
FIG. 11 is a view showing the concept of the semiconductor device production system when viewed from another angle.

FIG. 11 is a view showing the concept of the overall system of this embodiment that is cut out at a different angle from FIG. 10. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 11, a factory having a plurality of manufacturing apparatuses of a plurality of vendors, and the management systems of the vendors for these manufacturing apparatuses are connected via the external network of the factory, and maintenance information of each manufacturing apparatus is communicated. In FIG. 11, reference numeral 2010 denotes a manufacturing factory of a manufacturing apparatus user (semiconductor device manufacturer) where manufacturing apparatuses for various processes, e.g., an exposure apparatus 2020, resist processing apparatus 2030, and film formation apparatus 2040 are installed in the manufacturing line of the factory. FIG. 11 shows only one manufacturing factory 2010, but a plurality of factories are networked in practice. The respective apparatuses in the factory are connected to a LAN 2060 to construct an intranet, and a host management system 2050 manages the operation of the manufacturing line. The business offices of vendors (apparatus supply manufacturers) such as an exposure apparatus manufacturer 2100, resist processing apparatus manufacturer 2200, and film formation apparatus manufacturer 2300 comprise host management systems 2110, 2210, and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors for the respective apparatuses are connected via the Internet or dedicated-line network serving as an external network 2000. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 2000. This can minimize the stop of the manufacturing line.

Figure 12:
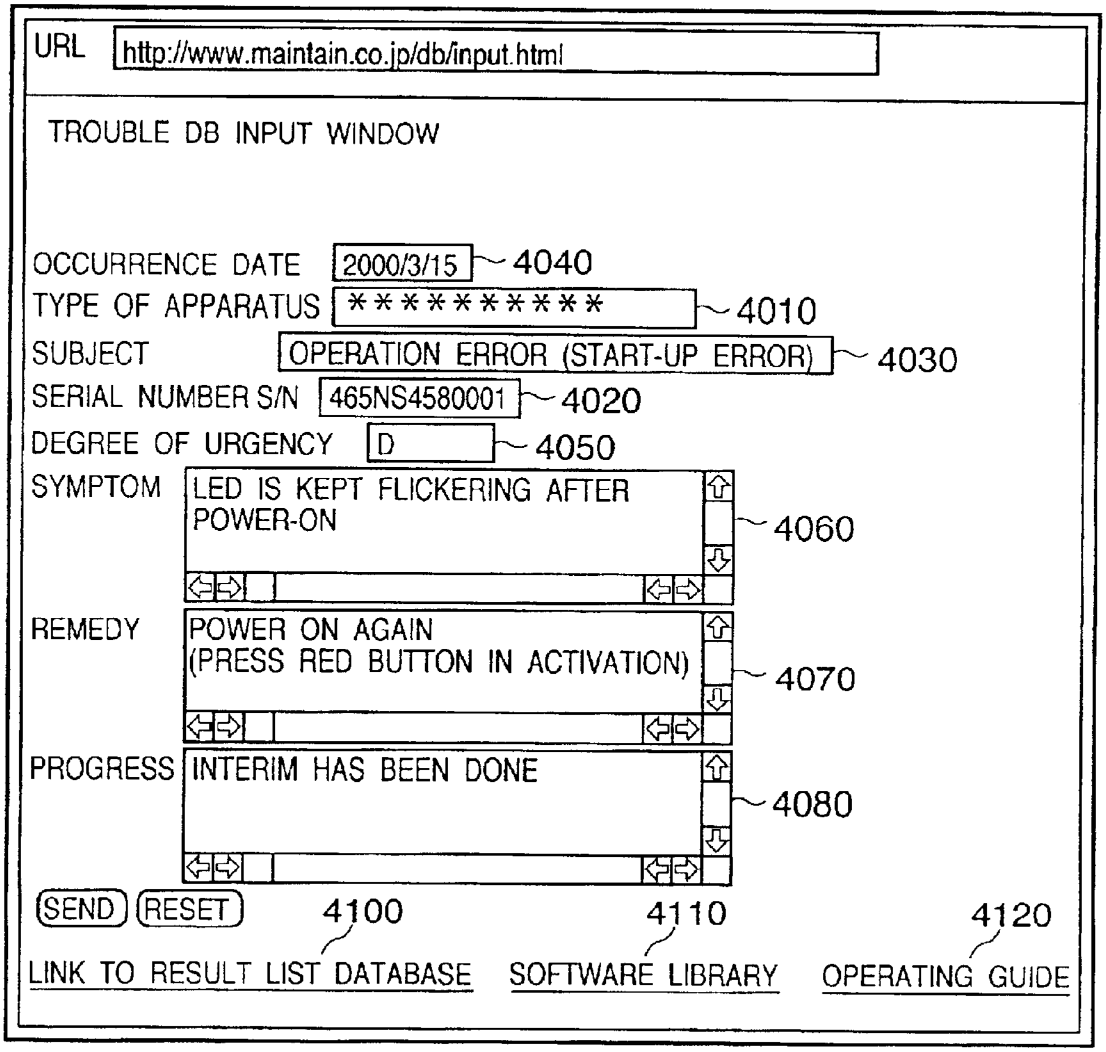
FIG. 12 is a view showing a user interface on a display.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 12 on the display. While referring to this window, the operator who manages manufacturing apparatuses in each factory inputs, in input items on the windows, pieces of information such as the type of manufacturing apparatus (4010), serial number (4020), subject of trouble (4030), occurrence date (4040), degree of urgency (4050), symptom (4060), remedy (4070), and progress (4080). The pieces of input information are transmitted to the maintenance database via the Internet, and appropriate maintenance information is sent back from the maintenance database and displayed on the display. The user interface provided by the web browser realizes hyperlink functions (4100 to 4120), as shown in FIG. 12. This allows the operator to access detailed information of each item, receive the latest-version software to be used for a manufacturing apparatus from a software library provided by a vendor, and receive an operation guide (help information) as a reference for the operator in the factory.

Figure 13:
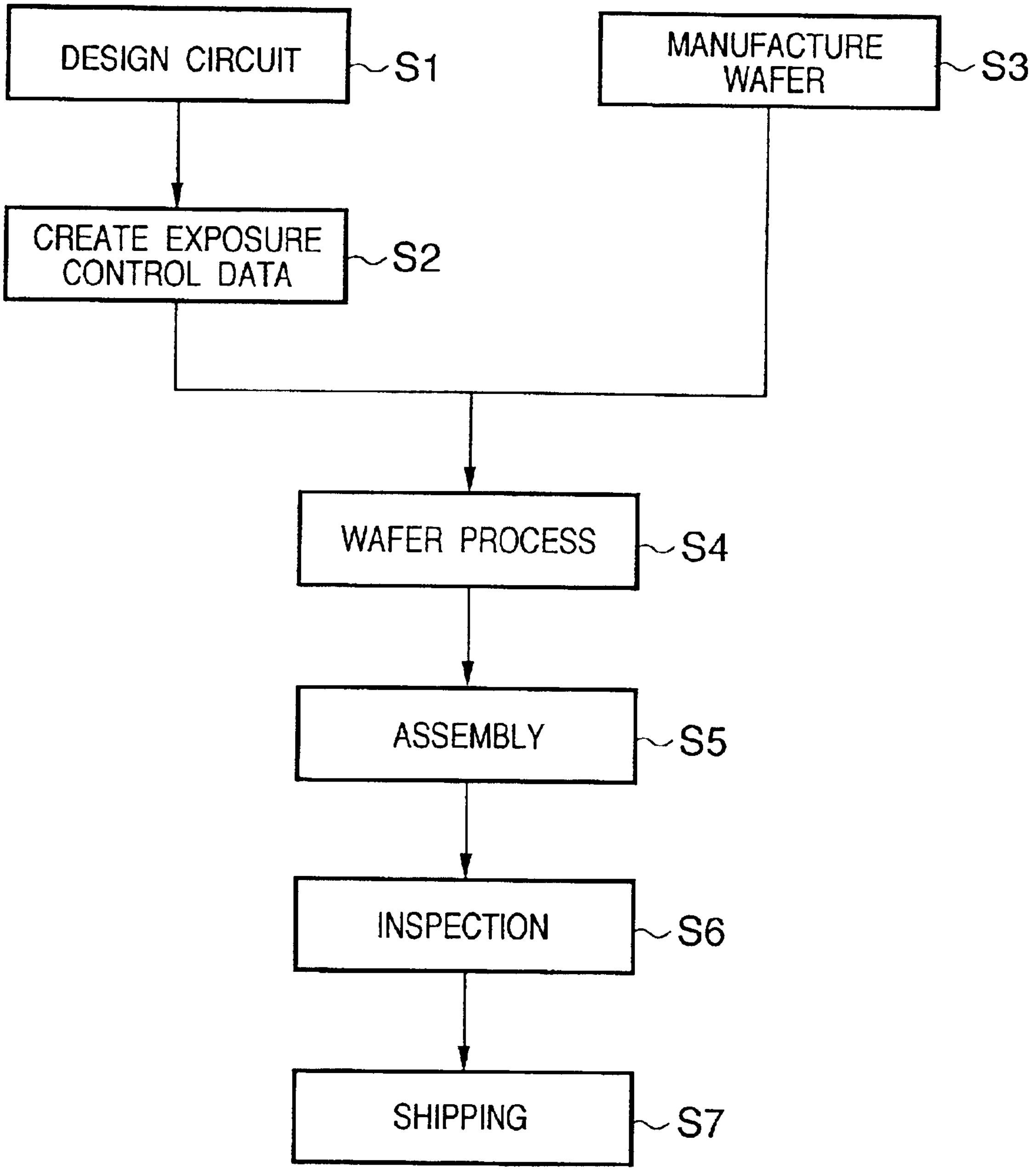
FIG. 13 is a flow chart for explaining the flow of a semiconductor device manufacturing process.

A semiconductor device manufacturing process using the above-described production system will be explained. FIG. 13 shows the flow of the whole manufacturing process of the semiconductor device. In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process may be performed in separate dedicated factories. In this case, maintenance is done for each of the factories by the above-described remote maintenance system. Information for production management and apparatus maintenance may be communicated between the pre-process factory and the post-process factory via the Internet or dedicated-line network.

Figure 14:
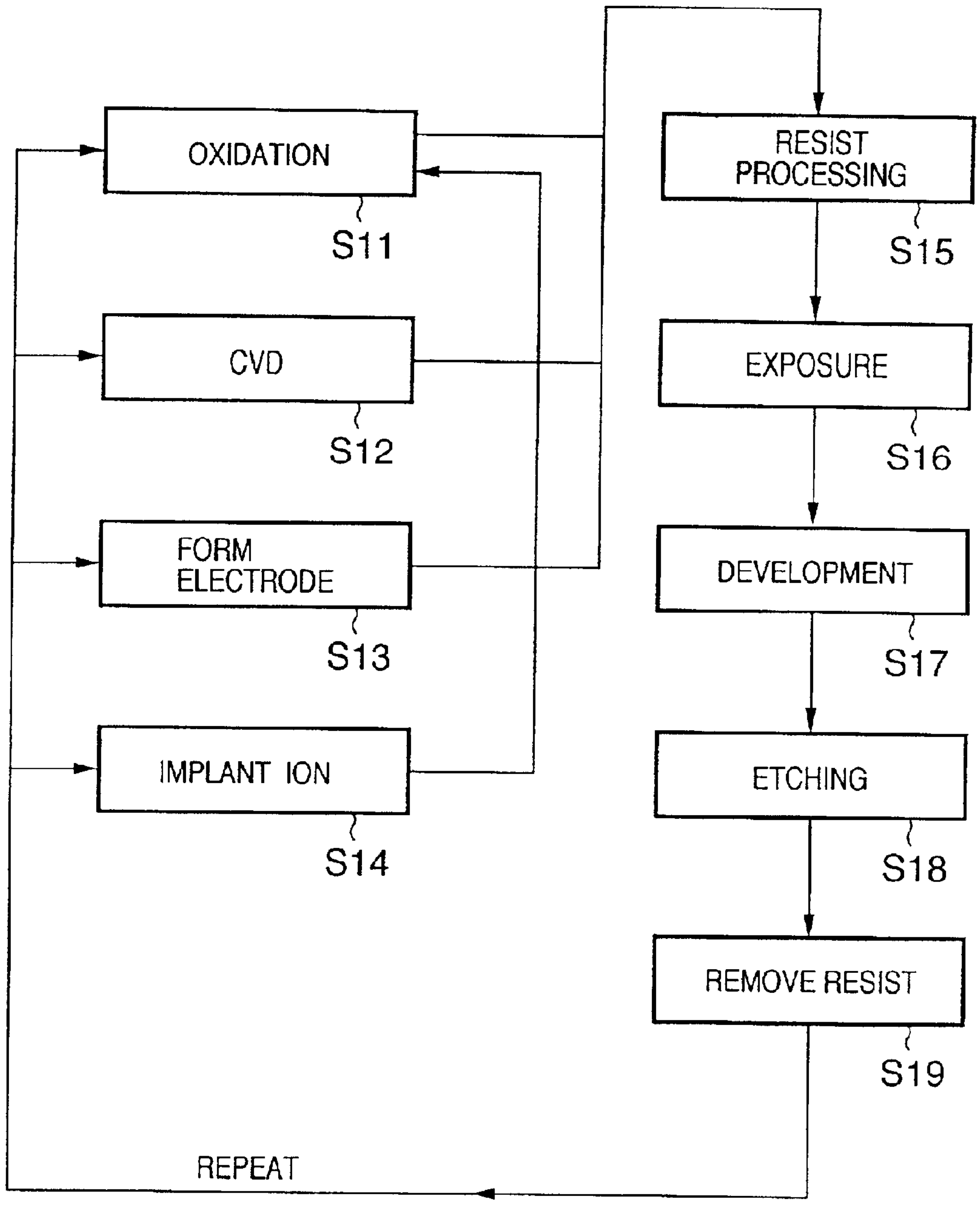
FIG. 14 is a flow chart for explaining details of a wafer process.

FIG. 14 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus draws (exposes) a circuit pattern on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if a trouble occurs, the manufacturing apparatus can be quickly recovered. The productivity of the semiconductor device can be increased in comparison with the prior art.

The present invention can provide an electron optical system array which realizes various conditions such as downsizing, high precision, and high reliability at high level.

The present invention can also provide a high-precision exposure apparatus using the electron optical system array, a high-productivity device manufacturing method, a semiconductor device production factory, and the like.

As many apparently widely different embodiments of the present invention can be made without departing from the spirit and scope thereof, it is to be understood that the invention is not limited to the specific embodiments thereof except as defined in the appended claims.

What is claimed is:

1. An electrode structure serving as a building component of an electron optical system array having a plurality of electron lenses comprising:

a substrate having a plurality of apertures for transmitting a plurality of charged-particle beams; and a plurality of electrodes extending from side surfaces of the plurality of apertures to peripheries of the plurality of apertures, wherein at least a surface of said substrate is insulated.

2. The structure according to claim 1, wherein the surface of said substrate has an insulating film.

3. The structure according to claim 1, wherein electrodes formed in at least two apertures are electrically connected.

4. The structure according to claim 1, wherein the plurality of apertures are arrayed, and electrodes formed in apertures of each column are electrically connected.

5. The structure according to claim 1, wherein the electrode structure further comprises an alignment position for aligning the electrode structure with another electrode structure.

6. The structure according to claim 1, wherein said substrate includes a silicon substrate covered with an insulating film after the plurality of apertures are formed.

7. An electron optical system array having a plurality of electron lenses, comprising a plurality of electrode structures which are arranged along paths of a plurality of charged-particle beams and have pluralities of apertures on the paths of the plurality of charged-particle beams, wherein at least one of said plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of said substrate is insulated.

8. The array according to claim 7, wherein the surface of said substrate has an insulating film.

9. The array according to claim 7, wherein electrodes formed in at least two apertures of said substrate are electrically connected.

10. The array according to claim 7, wherein the plurality of apertures of said plurality of electrode structures are arrayed, and electrodes formed in each column of said substrate are electrically connected.

11. The array according to claim 7, wherein said plurality of electrode structures include a shield electrode structure.

12. The array according to claim 7, wherein each of said plurality of electrode structures comprises a membrane portion which has the plurality of apertures and a support portion which supports the membrane portion, and the electron optical system array further comprises a spacer interposed between support portions of adjacent electrode structures to define a distance between the support portions.

13. The array according to claim 7, wherein each of said plurality of electrode structures comprises a membrane portion in which the plurality of apertures are formed and a support portion which supports the membrane portion, and the electron optical system array further comprises a spacer interposed between membrane portions of adjacent electrode structures to define a distance between the membrane portions.

14. The array according to claim 7, wherein each of said plurality of electrode structures comprises a membrane portion which has the plurality of apertures and a support portion which supports the membrane portion, and the electron optical system array further comprises:

a first spacer interposed between support portions of adjacent electrode structures to define a distance between the support portions; and a second spacer interposed between membrane portions of adjacent electrode structures to define a distance between the membrane portions.

15. A method of manufacturing an electrode structure serving as a building component of an electron optical system having a plurality of electron lenses, comprising the steps of:

forming in a substrate a plurality of apertures for transmitting a plurality of charged-particle beams;

covering the substrate having the plurality of apertures with an insulating film; and forming, in the substrate covered with the insulating film, a plurality of electrodes extending from side surfaces of the plurality of apertures to peripheries of the plurality of apertures.

16. The method according to claim 15, wherein the substrate includes a silicon substrate, and in the step of forming a plurality of apertures, a plurality of apertures are formed in the silicon substrate by plasma dry etching.

17. A charged-particle beam exposure apparatus comprising:

a charged-particle beam source for emitting a charged-particle beam;

an electron optical system array which has a plurality of electron lenses and forms a plurality of intermediate images of said charged-particle beam source by the plurality of electron lenses; and a projection electron optical system for projecting on a substrate the plurality of intermediate images formed by said electron optical system array, wherein said electron optical system array includes a plurality of electrode structures which are arranged along paths of a plurality of charged-particle beams concerning the plurality of intermediate images and have pluralities of apertures on the paths of the plurality of charged-particle beams, at least one of said plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of said substrate is insulated.

18. A device manufacturing method comprising the steps of:

installing a plurality of semiconductor manufacturing apparatuses including a charged-particle beam exposure apparatus in a factory; and manufacturing a semiconductor device by using the plurality of semiconductor manufacturing apparatuses, wherein the charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array, the electron optical system array includes a plurality of electrode structures which are arranged along paths of a plurality of charged-particle beams concerning the plurality of intermediate images and have pluralities of apertures on the paths of the plurality of charged-particle beams, at least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

19. The method according to claim 18, further comprising the steps of:

connecting the plurality of semiconductor manufacturing apparatuses by a local area network;

connecting the local area network to an external network of the factory;

acquiring information about the charged-particle beam exposure apparatus from a database on the external network by using the local area network and the external network; and controlling the charged-particle beam exposure apparatus on the basis of the acquired information.

20. A semiconductor manufacturing factory comprising:

a plurality of semiconductor manufacturing apparatuses including a charged-particle beam exposure apparatus;

a local area network for connecting said plurality of semiconductor manufacturing apparatuses; and a gateway for connecting the local area network to an external network of said semiconductor manufacturing factory, wherein said charged-particle beam exposure apparatus includes a charged-particle beam source for emitting a charged-particle beam, an electron optical system array which has a plurality of electron lenses and forms a plurality of intermediate images of said charged-particle beam source by the plurality of electron lenses, and a projection electron optical system for projecting on a substrate the plurality of intermediate images formed by said electron optical system array, said electron optical system array includes a plurality of electrode structures which are arranged along paths of a plurality of charged-particle beams concerning the plurality of intermediate images and have pluralities of apertures on the paths of the plurality of charged-particle beams, at least one of said plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of said substrate is insulated.

21. A maintenance method for a charged-particle beam exposure apparatus, comprising the steps of:

preparing a database for strong information about maintenance of the charged-particle beam exposure apparatus on an external network of a factory where the charged-particle beam exposure apparatus is installed;

connecting the charged-particle beam exposure apparatus to a local area network in the factory; and maintaining the charged-particle beam exposure apparatus on the basis of the information stored in the database by using the external network and the local area network, wherein the charged-particle beam exposure apparatus includes a charged-particle beam source for emitting a charged-particle beam, an electron optical system array which as a plurality of electron lenses and forms a plurality of intermediate images of the charged-particle beam source by the plurality of electron lenses, and a projection electron optical system for projecting on a substrate the plurality of intermediate images formed by the electron optical system array, the electron optical system array includes a plurality of electrode structures which are arranged along paths of a plurality of charged-particle beams concerning the plurality of intermediate images and have plurality of apertures on the paths of the plurality of charged-particle beams, at least one of the plurality of electrode structures includes a substrate having a plurality of apertures for transmitting the plurality of charged-particle beams, and a plurality of electrodes extending from side surfaces of the plurality of apertures to peripheries of the plurality of apertures, and at least a surface of the substrate is insulated.

22. An electrode plate which controls a charged-particle beam, the electrode plate comprising:

a substrate having an aperture;

an insulating layer arranged to coat a surface of the substrate and a side surface of the aperture of the substrate; and an electrode layer arranged to coat the insulating layer, wherein the surface of the substrate comprises a portion coated with the insulating layer but not coated with the electrode layer.

23. The electrode plate according to claim 22, wherein the substrate comprises silicon, the insulating layer comprises silicon oxide, and the electrode layer comprises gold.

24. A charged-particle beam exposure apparatus, comprising:

a charged-particle beam source;

an electrode plate arranged to control a charged-particle beam, the electrode plate comprising a substrate having an aperture, an insulating layer arranged to coat a surface of the substrate and a side surface of the aperture of the substrate, and an electrode layer arranged to coat the insulating layer, wherein the surface of the substrate comprises a portion coated with the insulating layer but not coated with the electrode layer; and a stage arranged to support a sample to be patterned with the charged-particle beam controlled by the electrode plate.

25. A device manufacturing method comprising:

patterning a sample with the charged-particle beam exposure apparatus defined in claim 24; and developing the patterned sample.

* * * * *

UNITED STATES PATENT AND TRADEMARK OFFICE

CERTIFICATE OF CORRECTION

PATENT NO. : 6,872,952 B2
DATED : March 29, 2005
INVENTOR(S) : Yasuhiro Shimada et al.

It is certified that error appears in the above-identified patent and that said Letters Patent is hereby corrected as shown below:

Title page,
Item [56], References Cited, U.S. PATENT DOCUMENTS,
"6,381,702 B1 4/2002 Ogasawara ............... 713/500" should read
-- 6,381,072 B1 4/2002 Ogasawara ............... 713/500 --.

Column 5,
Lines 2 and 9, "to" should read -- to the --.

Column 6,
Line 38, "6 h" should read -- 6 hours --.

Column 7,
Line 24, "preferably" should read -- preferable --.

Column 11,
Line 62, "stop" should read -- stoppage --.

Column 16,
Line 46, the second occurrence of "plurality" should read -- a plurality --.

Signed and Sealed this

Nineteenth Day of July, 2005

JON W. DUDAS
*Director of the United States Patent and Trademark Office*